United States Patent [19]

Pedersen et al.

[11] Patent Number: 5,384,499
[45] Date of Patent: Jan. 24, 1995

[54] HIGH-DENSITY ERASABLE PROGRAMMABLE LOGIC DEVICE ARCHITECTURE USING MULTIPLEXER INTERCONNECTIONS

[75] Inventors: Bruce B. Pedersen, San Jose; David Chiang, Saratoga; Francis B. Heile, Santa Clara; Cameron McClintock, Mountain View; Hock-Chuen So, Redwood City; James A. Watson, Santa Clara, all of Calif.

[73] Assignee: Altera Corporation, San Jose, Calif.

[21] Appl. No.: 123,435

[22] Filed: Sep. 17, 1993

Related U.S. Application Data

[63] Continuation-in-part of Ser. No. 43,146, Mar. 31, 1993, Pat. No. 5,268,598, which is a continuation of Ser. No. 957,091, Oct. 6, 1992, abandoned, which is a continuation of Ser. No. 691,640, Apr. 25, 1991, Pat. No. 5,241,224.

[51] Int. Cl.$^6$ ........................................... H03K 19/177
[52] U.S. Cl. ................................... 326/39; 326/41; 326/10; 326/16; 327/407
[58] Field of Search ................. 307/443, 465, 465.1, 307/468–469, 473, 441, 243

[56] References Cited

U.S. PATENT DOCUMENTS

| | | | |
|---|---|---|---|
| 4,758,746 | 10/1986 | Hartmann et al. | 307/465 |
| 4,870,304 | 9/1989 | Bloker et al. | 307/468 |
| 4,871,930 | 10/1989 | Wong et al. | 307/465 |
| 4,899,067 | 2/1990 | So et al. | 307/465 |
| 4,912,342 | 3/1990 | Wong et al. | 307/465 |
| 4,933,575 | 6/1990 | Aso | 307/465 |
| 4,933,577 | 6/1990 | Wong et al. | 307/465 |
| 4,963,768 | 10/1990 | Agrawal et al. | 307/465 |
| 4,965,474 | 10/1990 | Childers et al. | 307/542 |
| 4,983,959 | 1/1991 | Breuninger | 340/825 |
| 5,046,035 | 9/1991 | Jigour et al. | 364/716 |
| 5,079,451 | 1/1992 | Gudger et al. | 307/465 |
| 5,089,973 | 2/1992 | Furtek | 364/489 |
| 5,095,523 | 3/1992 | Delaruelle et al. | 395/800 |
| 5,132,570 | 7/1992 | Shutou et al. | 307/465 |
| 5,144,166 | 9/1992 | Camarota et al. | 307/465 |
| 5,198,705 | 3/1993 | Galbraith et al. | 307/465 |
| 5,258,668 | 11/1993 | Cliff et al. | 307/465.1 X |
| 5,300,830 | 4/1994 | Hawes | 307/465.1 X |
| 5,302,865 | 4/1994 | Steele et al. | 307/465 |
| 5,317,210 | 5/1994 | Patel | 307/443 X |

*Primary Examiner*—David R. Hudspeth
*Attorney, Agent, or Firm*—Jeffrey H. Ingerman; Robert W. Morris

[57] ABSTRACT

A programmable logic device is presented comprising a global interconnect array whose lines are fed via programmable multiplexers to logic array blocks. The global interconnect array lines are fed to the multiplexers in a specific pattern which maximizes the user's ability to route a selected line to the output of a selected multiplexer, while at the same time maintaining higher speed and lower power consumption, and using less chip array than prior art programmable logic devices using programmable interconnect arrays based on erasable programmable read-only memories.

32 Claims, 13 Drawing Sheets

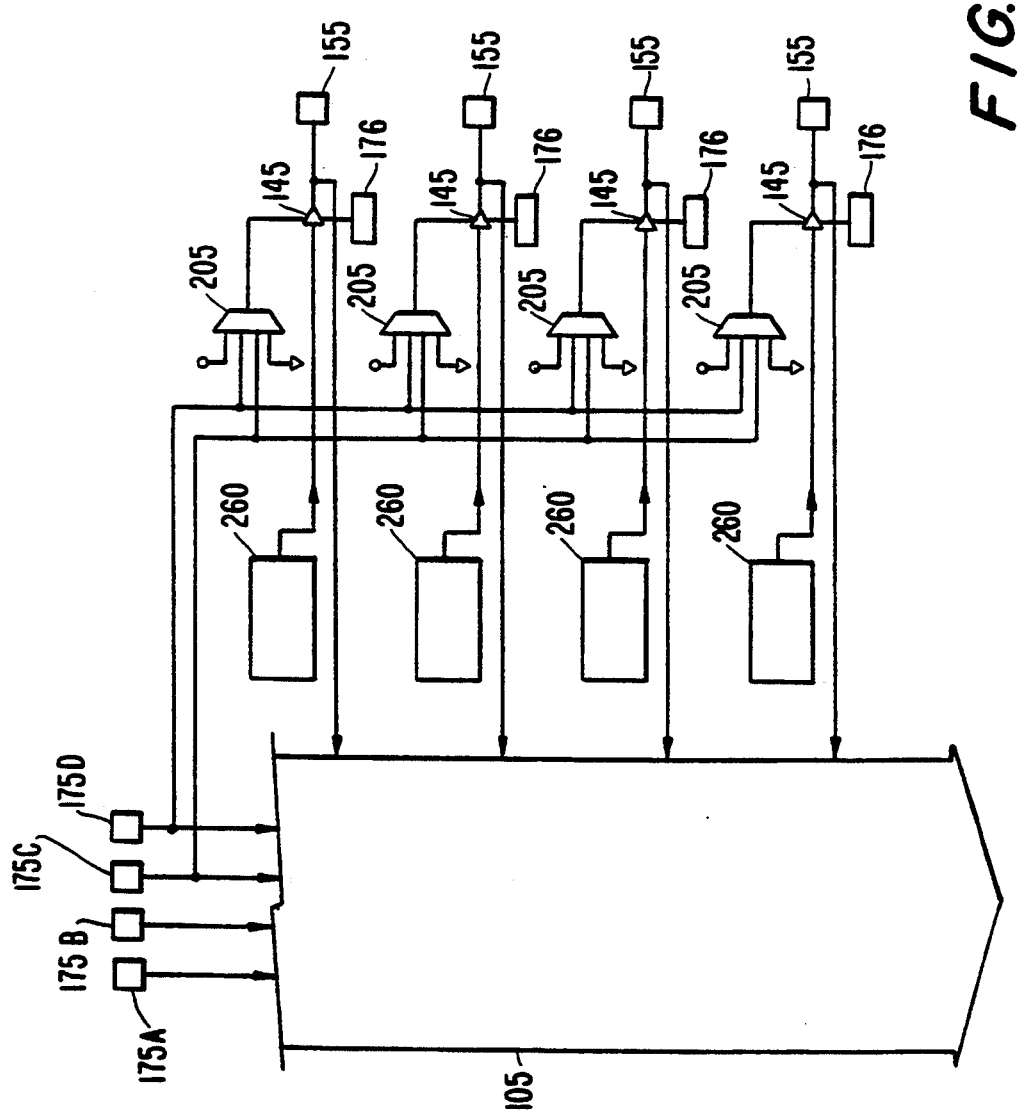

```
F00A feeds  MUX01 @00  MUX02 @00    . * * . . . . . . .
F01A feeds  MUX03 @00  MUX04 @00    . . . * * . . . . .
F02A feeds  MUX05 @00  MUX06 @00    . . . . . * * . . .
F03A feeds  MUX07 @00  MUX08 @00    . . . . . . . * * .
F00B feeds  MUX00 @00  MUX01 @01    * * . . . . . . . .
F01B feeds  MUX02 @01  MUX03 @01    . . * * . . . . . .
F02B feeds  MUX04 @01  MUX05 @01    . . . . * * . . . .
F03B feeds  MUX06 @01  MUX07 @01    . . . . . . * * . .
F00C feeds  MUX00 @01  MUX08 @01    * . . . . . . . . *
F01C feeds  MUX01 @02  MUX03 @02    . * . * . . . . . .
F02C feeds  MUX02 @02  MUX06 @02    . . * . . . * . . .
F03C feeds  MUX04 @02  MUX07 @02    . . . . * . . * . .
F00D feeds  MUX05 @02  MUX08 @02    . . . . . * . . . *
F01D feeds  MUX00 @02  MUX02 @03    * . * . . . . . . .
F02D feeds  MUX01 @03  MUX07 @03    . * . . . . . * . .
F03D feeds  MUX04 @03  MUX06 @03    . . . . * . * . . .
F00E feeds  MUX00 @03  MUX05 @03    * . . . . * . . . .
F01E feeds  MUX03 @03  MUX08 @03    . . . * . . . . . *
F02E feeds  MUX01 @04  MUX06 @04    . * . . . . * . . .
F03E feeds  MUX02 @04  MUX04 @04    . . * . * . . . . .
F00F feeds  MUX00 @04  MUX03 @04    * . . * . . . . . .
F01F feeds  MUX01 @05  MUX05 @04    . * . . . * . . . .
F02F feeds  MUX02 @05  MUX07 @04    . . * . . . . * . .
F03F feeds  MUX04 @05  MUX08 @04    . . . . * . . . . *
F00G feeds  MUX00 @05  MUX07 @05    * . . . . . . * . .
F01G feeds  MUX03 @05  MUX05 @05    . . . * . * . . . .
F02G feeds  MUX06 @05  MUX08 @05    . . . . . . * . . *
F03G feeds  MUX01 @06  MUX04 @06    . * . . * . . . . .
F00H feeds  MUX00 @06  MUX06 @06    * . . . . . * . . .
F01H feeds  MUX02 @06  MUX05 @06    . . * . . * . . . .
F02H feeds  MUX03 @06  MUX07 @06    . . . * . . . * . .
F03H feeds  MUX01 @07  MUX08 @06    . * . . . . . . . *
F00I feeds  MUX00 @07  MUX04 @07    * . . . * . . . . .
F01I feeds  MUX02 @07  MUX08 @07    . . * . . . . . . *
F02I feeds  MUX03 @07  MUX06 @07    . . . * . . * . . .
F03I feeds  MUX05 @07  MUX07 @07    . . . . . * . * . .
```

*FIG. 4E*

HIGH-DENSITY ERASABLE PROGRAMMABLE LOGIC DEVICE ARCHITECTURE USING MULTIPLEXER INTERCONNECTIONS

CROSS REFERENCE TO RELATED APPLICATIONS

This application is a continuation-in-part of co-pending U.S. patent application Ser. No. 08/043,146, filed Mar. 31, 1993, now U.S. Pat. No. 5,268,598, which was a continuation of U.S. patent application Ser. No. 07/957,091, filed Oct. 6, 1992, now abandoned, which was a continuation of U.S. patent application Ser. No. 07/691,640, filed Apr. 25, 1991, now U.S. Pat. No. 5,241,224.

BACKGROUND OF THE INVENTION

This invention relates to programmable logic devices, and more particularly to a new architecture for an erasable programmable logic device ("EPLD") using a multiplexer-based global interconnect array ("GIA") which allows for EPLDs with higher speed and the ability to realize more complex functions than previously possible.

As shown by commonly-assigned U.S. Pat. No. 4,871,930 ("Wong"), which is hereby incorporated by reference in its entirety, and the references cited therein, programmable logic devices ("PLDs") are well known. As described in Wong, a major obstacle in increasing the logic density in previously known PLDs was the size of the single global interconnection array which increased as the square of the number of output functions. This obstacle was overcome to a large extent by the use of a programmable interconnect array ("PIA") disclosed in Wong. In a PLD using a PIA, a single global interconnection array using erasable programmable read-only memory ("EPROM") cells was used to route signals to and from logic array blocks ("LABs") which contained logic elements, macrocells, and a local interconnection array.

The architecture using PIAs and LABs disclosed in Wong produced a generation of successful PLDs available commercially from Altera Corporation of San Jose, Calif. Yet, to meet ever increasing technological demands, PLDs have been constantly increasing in both size and complexity. In particular, to achieve higher logic density, more logic elements have been incorporated into PLDs and this has necessitated increasing the size of the PIA.

However, a significant amount of the power used in PLDs is consumed in the programmable elements of the PIA, and a major speed limitation is capacitive loading in the programmable elements of the PIA. Increasing the size of the PIA, therefore, leads undesirably to higher power consumption and reduction in speed.

In view of the foregoing, it would be desirable to be able to provide a PLD architecture in which power consumption is reduced by eliminating programmable elements from the PIA.

It would further be desirable to be able to provide a PLD architecture in which speed is increased by reducing capacitive loading on the interconnect array.

It would also be desirable to be able to provide a PLD architecture having a greatly increased probability of successfully routing the required signals between LABs.

SUMMARY OF THE INVENTION

It is an object of this invention to provide a PLD architecture in which power consumption is reduced by eliminating programmable elements from the PIA.

It is a further object of this invention to provide a PLD architecture in which speed is increased by reducing capacitive loading on the interconnect array.

These and other objects are accomplished in accordance with the principles of the present invention by providing a PLD architecture in which programmable elements in the PIA are replaced by a group of multiplexers in a new global interconnect array ("GIA"). In a preferred embodiment of the present invention, each multiplexer is able to feed two LABs instead of one, and the signals from the multiple multiplexers may themselves be multiplexed into the LABs so that no additional data paths into the LABs are required.

It has now been determined that, as the complexity of PLDs increases, the increase in the number of programmable elements in the PIA is responsible for a significant increase in the amount of the power consumed, and is responsible for a significant decrease in the speed due to the capacitive loading of EPROM cells. Furthermore, it has now been observed that only a small fraction of the total number of EPROM cells in the PIA is used, so that most of the increased capacitive loading and power consumption is unnecessary.

Accordingly, in the present invention, the programmable elements and thus their associated power consumption and capacitive loading have been eliminated by replacing the PIA with an alternative GIA. In the GIA, selected global conductors are connected to the inputs of multiplexers in a predetermined pattern, and the outputs of the multiplexers are connected to the inputs of macrocells in the LABs. Alternatively, the outputs of the multiplexers may be connected to additional multiplexers which are connected to the inputs of macrocells in the LABs so that the multiplexers may be connected to more than one LAB.

Replacement of the PIA with a GIA allows for higher logic density than previously possible. For example, a preferred embodiment of the present invention provides up to twice the density of the EPM5128, available commercially from Altera Corporation of San Jose, Calif. The preferred embodiment comprises sixteen LABs interconnected with a high speed GIA. Each LAB contains sixteen macrocells that share a programmable local EPROM array.

Programmability through the use of a global EPROM in the PIA of prior PLDs is replaced in the present invention by programmability of the multiplexers connected to the GIA. The multiplexers are controlled by an array of programmable architecture bits so that the signals on selected global conductors can be routed to the inputs of selected macrocells. When each multiplexer is configured to feed multiple LABs, the programmability of the multiplexers to achieve a successful routing is made easier because each signal has four ways to enter the LAB instead of two.

Elimination of the programmable elements reduces the capacitive loading on the bit-lines, thus increasing the speed of the PLD. In addition, a small number of multiplexers consumes less power than a large number of EPROM cells, so the total amount of power consumed by the PLD is reduced.

BRIEF DESCRIPTION OF THE DRAWINGS

The above and other objects and advantages of the invention will be apparent upon consideration of the following detailed description, taken in conjunction with the accompanying drawings, in which like reference numerals refer to like parts throughout, and in which:

FIG. 2 is a simplified schematic block diagram of an illustrative input/output architecture of the present invention;

FIG. 4E is a tabular representation of an interconnection pattern which maximizes routing ability;

DETAILED DESCRIPTION OF THE INVENTION

A. Overall Architecture

Figure 1A:
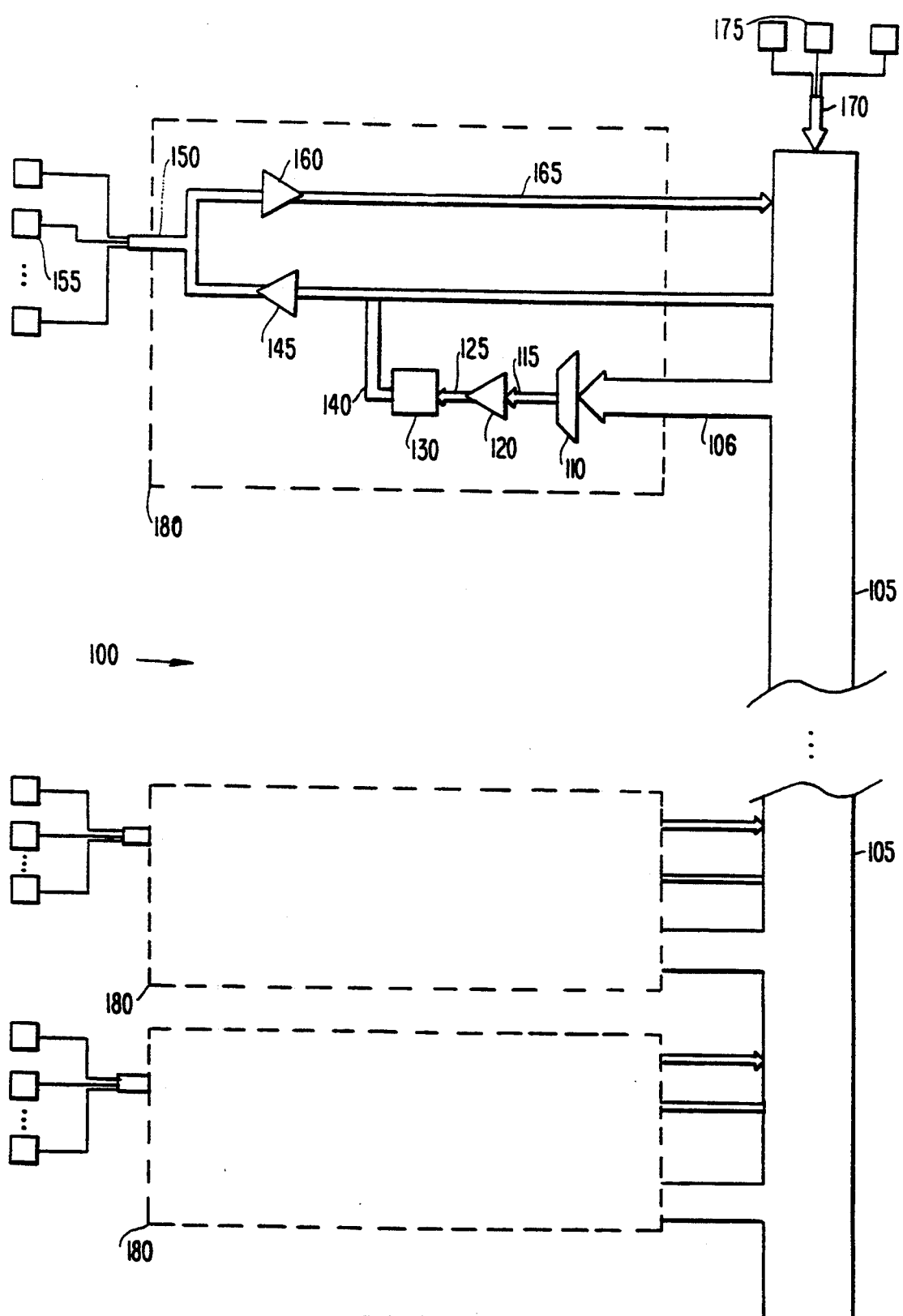
FIG. 1A is a schematic block diagram of an illustrative embodiment of the present invention.

FIG. 1A is a simplified overall block diagram of an illustrative embodiment of a programmable logic device ("PLD") 100 constructed in accordance with the present invention. PLD 100 comprises: a plurality of modules 180; global interconnect array ("GIA") 105 for interconnecting modules 180; dedicated input pads 175 which can be used to direct input directly to GIA 105; and input/output ("I/O") pads 155 which can be used either as input pads to send data indirectly through module 180 to GIA 105, or as output pads to transmit data from module 180.

Selected lines 106 connect, and are used to send data from, GIA 105 to modules 180. The preferred methods for selecting and assigning lines 106 are described below.

Module 180 comprises multiplexer 110, buffers 120, 145, and 160, logic array block ("LAB") 130, and lines 115, 125, 140, 150, and 165.

Figure 1B:
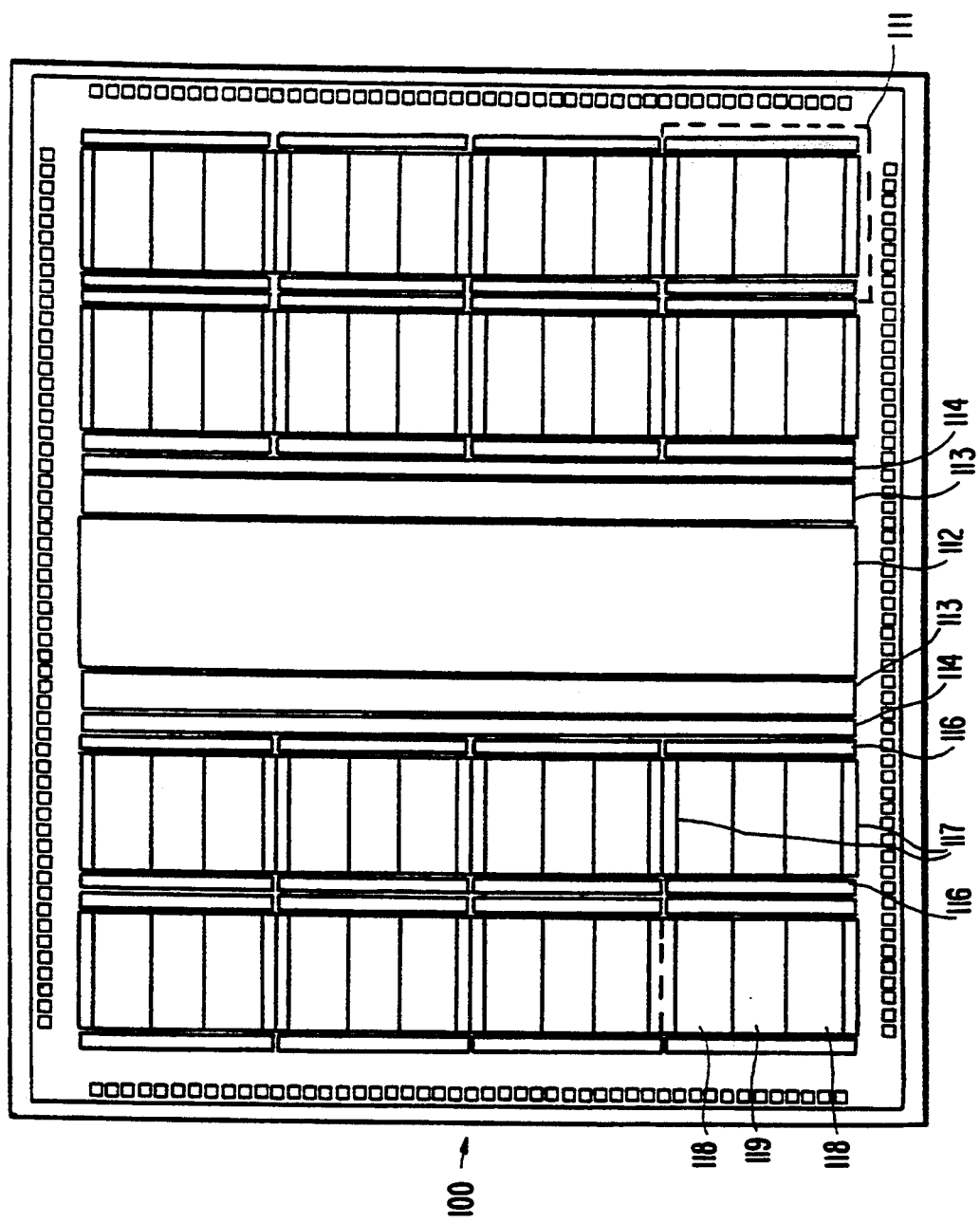
FIG. 1B is a simplified plan view of chip a for an embodiment of the present invention.

FIG. 1B shows a preferred chip layout for a PLD constructed in accordance with the principles of the present invention. The PLD chip layout of FIG. 1B comprises LABs 111 surrounding GIA and multiplexer block 112.

Each LAB 111 comprises word line driver blocks 116, I/O bussing blocks 117 containing buffers 145, and macrocell blocks 118 on two sides of local EPROM array 119. GIA driver blocks 114 containing buffers 160 are positioned between LABs 111 and GIA and multiplexer block 112.

Surrounding block 112 are latches 113 which contain multiplexer architecture bits (i.e., data which controls the programming of multiplexers 110). Configuration information is stored in architectural bits embedded inside the LAB's EPROM arrays 119. The contents of these bits are automatically loaded to configuration latches 113 during power-up. The flexibility provided by these architectural bits allows for very efficient use of chip area in implementations of logic functions.

B. Input and Output

Input signals to PLD 100 are supplied to GIA 105 either directly from dedicated inputs 175 or indirectly from I/O pads 155 which can be configured as inputs or outputs.

When I/O pads 155 are configured as inputs, they supply input signals via lines 150, buffers 160, and lines 165 to GIA 105.

When I/O pads 155 are configured as outputs, they receive processed data from LAB 130 via lines 140 and buffers 145. LAB 130 processes the data communicated to it via lines 125 from GIA 105. The outputs of LAB 130 are also fed back into GIA 105 via lines 140.

FIG. 2 shows a simplified schematic block diagram of a preferred I/O architecture. Preferably, PLD 100 includes a large number of I/O pads 155 and dedicated input pads 175A to 175D to support I/O intensive applications. For example, a preferred embodiment has 160 I/O pads and four dedicated input pads in a 208-pin package.

Preferably four dedicated inputs 175A, 175B, 175C, and 175D provide inputs to GIA 105, or, for example, input 175A can be used as a global clock signal, input 175B can be used as a global clear signal, and inputs 175C and 175D can be used as output enable signals.

Programmable latches 176 provide a programmable architecture bit for each output 155 to allow individual slew rate control of pad drivers 145. Latches 176 control output tri-state buffers 145 so that, when latch 176 is in one state, the output voltage of buffer 145 can slew rapidly, and in the other state the output voltage slews more slowly. The user can control slew rate architecture bits stored in latches 176 so that only speed-critical outputs operate at maximum slew rate. Output signals which are not speed-critical can be slowed down, thus reducing output switching noise.

Buffers 145 can operate in tri-state mode so that pads 155 can be configured as inputs or outputs. When pads 155 are configured as outputs, logic levels on output enable pads 175C and 175D, through device 205, switch buffers 145 into a low output impedance mode in which the outputs of macrocells 260 are routed to pads 155. When pads 155 are configured as inputs, tri-state buffers 145 are switched to a high output impedance mode in which external signals appearing on pads 155 are routed into GIA 105.

C. Logic Array Blocks

Figure 3A:
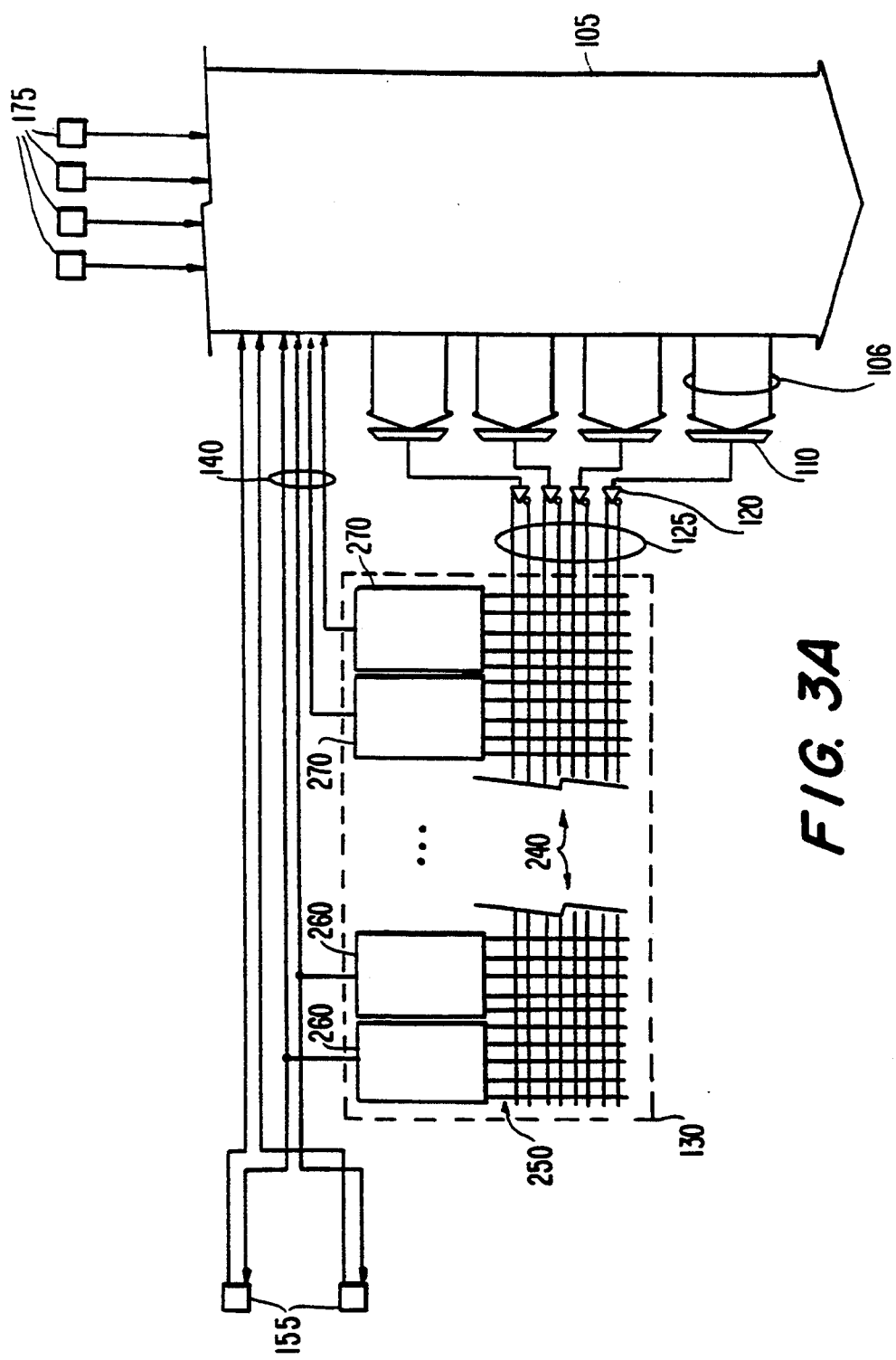
FIG. 3A is a simplified schematic block diagram of the illustrative embodiment of FIG. 1A showing a logic array block.

FIG. 3A shows a simplified, block schematic diagram of a portion of PLD 100 constructed in accordance with the present invention, in which a simplified representation of LAB 130 is shown.

LAB 130 comprises input/output macrocells 260 and buried macrocells 270 (described below), word lines 125, and bit lines 250. EPROM array 240 provides programmable interconnections between word lines 125 and bit lines 250.

Selected groups of lines 106 from GIA 105 are connected to multiplexers 110. In a preferred embodiment, shown in FIG. 3B, multiplexer 110 comprises n pass transistors 351 with terminal 352 of each transistor connected to common node 353 corresponding to the output of multiplexer 110, and each terminal 354 of transistor 351 corresponding to an input 357 of multiplexer 110 connected to a respective global conductor. Gate 355 of each transistor 351 is controlled by programmable element (or "architecture bit") 356 which forms part of EPROM array 240. Architecture bits in EPROM array 240, which are programmed by the user, thus select which of the lines of group 106 are connected to respective buffers 120. Buffers 120 provide both true replicas and complements of the signals at their inputs. These true and complement signals are fed into LAB 130 to form word lines 125 in EPROM array 240.

EPROM array 240 is a matrix of memory cells having a plurality of input word lines 125 and a plurality of output bit lines 250. The signal on each bit line is a logical product of the signals on a selected group of the word lines. The particular group of lines selected for each bit line is programmed by the user. Bit lines 250 from array 240 are fed to the inputs of identical macrocells 260 and 270.

Figure 3B:
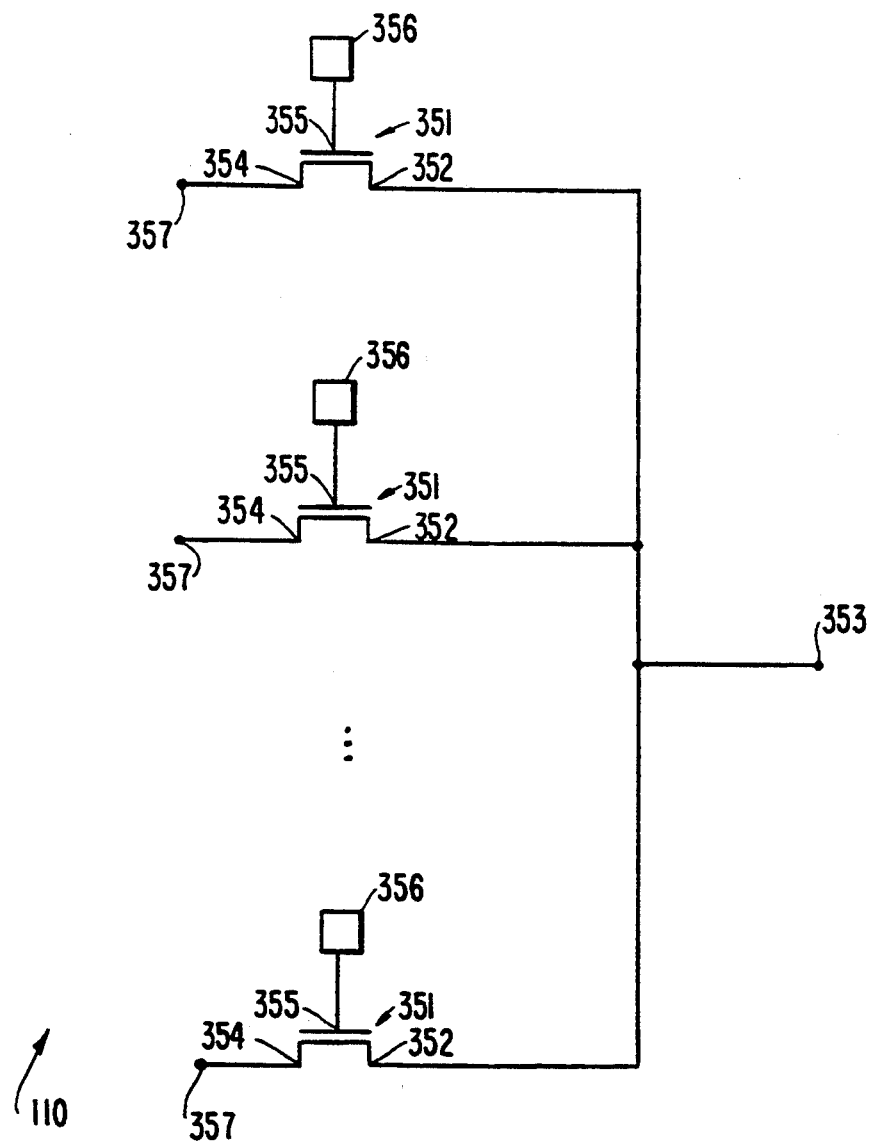
FIG. 3B is a schematic block diagram of a preferred embodiment of a multiplexer.
Figure 3C:
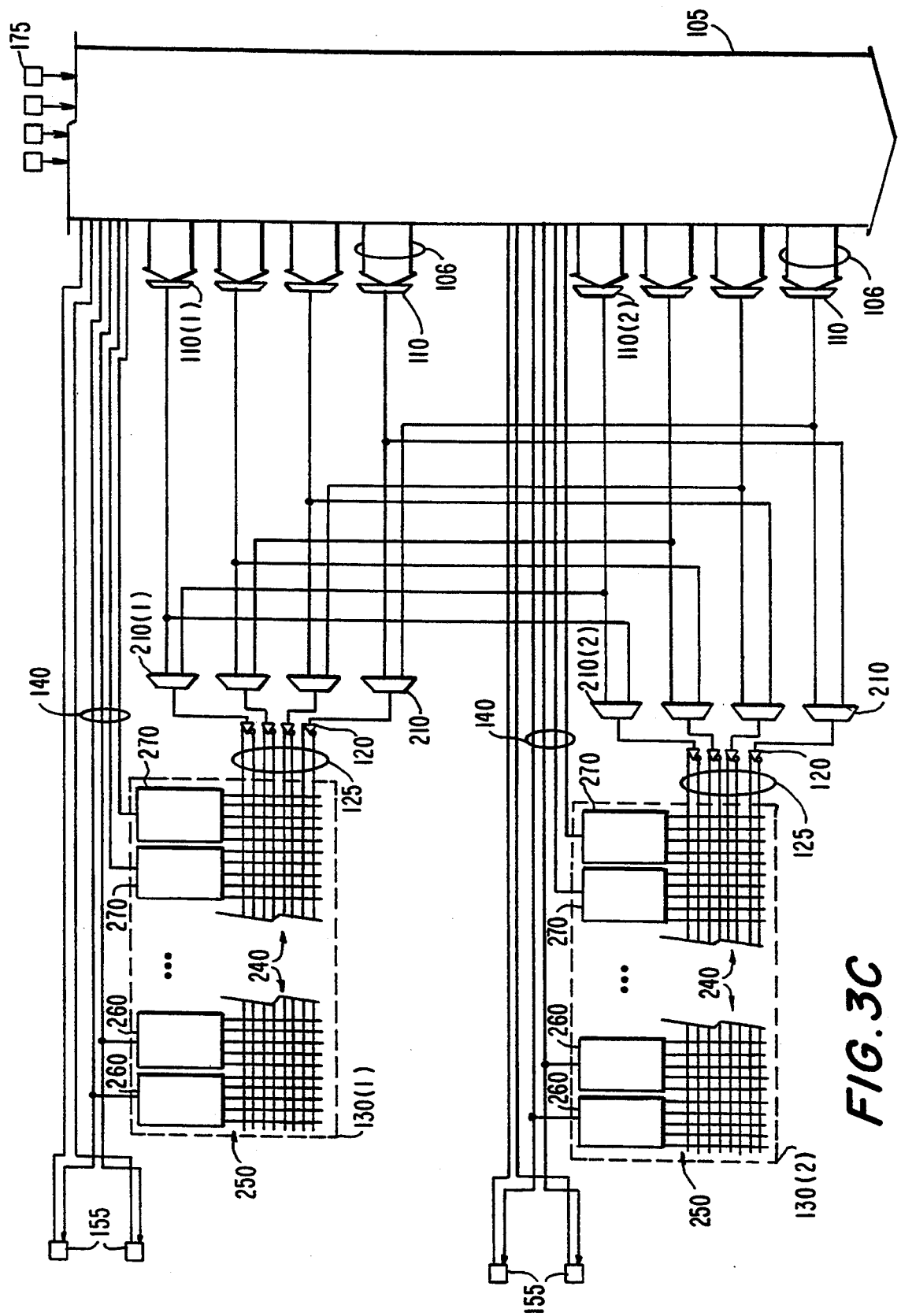
FIG. 3C is a schematic block diagram of another preferred embodiment of FIG. 1A showing a logic array block.

FIG. 3C shows a simplified, block schematic diagram of a portion of PLD 100 constructed in accordance with an alternate preferred embodiment of the present invention, in which a simplified representation of LAB 130 is shown as LAB 130(1) and LAB 130(2).

LABs 130(1) and 130(2) comprise input/output macrocells 260 and buried macrocells 270 (described below), word lines 125, and bit lines 250. EPROM array 240 provides programmable interconnections between word lines 125 and bit lines 250.

Selected groups of lines 106 from GIA 105 are connected to multiplexers 110 (as described above with respect to FIG. 3B). However, in this embodiment of the present invention, each output of multiplexers 110 is supplied as an input to two different multiplexers 210, where both of the multiplexers 210 are connected to different LABs 130. For example, the output of multiplexer 110(1) is provided as an input to multiplexers 210(1) and 210(2), which are connected to LABs 130(1) and 130(2), respectively. It should be noted that in this embodiment of the present invention, multiplexers 210(1) and 210(2) are not identical, and therefore, ultimately must be fed by different sets of signals 106.

Multiplexers 210 may comprise n pass transistors, in the same manner as shown in FIG. 3B, except that input 357 of multiplexer 210 is instead connected to the output 353 of the respective multiplexer 110 and the output 353 of multiplexer 210 is connected to the respective buffer 120. Gate 355 of each transistor 351 is controlled by programmable element (or "architecture bit") 356 which forms part of EPROM array 240. Architecture bits in EPROM array 240, which control gates 355 in both multiplexers 110 and 210 and are programmed by the user, thus select which of the lines of group 106 are connected to respective buffers 120 via multiplexers 110 and 210. Buffers 120 provide both true replicas and complements of the signals at their inputs. These true and complement signals are fed into each LAB 130 to form word lines 125 in EPROM array 240.

In this manner, each multiplexer 110 can feed one of select lines 106 into two different LABs 130. By providing an extra path for each signal, this embodiment provides four ways for the signal from each macrocell 260 or 270 or each I/O pad 155 to get into each LAB 130, thus greatly increasing the probability of successfully routing all of the required signals into each respective LAB 130. By controlling the operation of multiplexers 210, each multiplexer 110 feeds either one, two or no LABs 130.

D. Macrocells

A preferred embodiment of macrocells 260 and 270 is described fully in co-pending, commonly assigned U.S. patent application Ser. No. 07/688,252, filed Apr. 22, 1991, now U.S. Pat. No. 5,121,006, which is hereby incorporated by reference in its entirety.

In a preferred embodiment, each macrocell comprises five product terms and a programmable register providing D, T, SR, or JK flip-flop capability. The product terms can be used as primary inputs to generate combinatorial functions, or as secondary inputs to provide individual asynchronous clear, set, clock, and clock-enable signals for the flip-flop as well as an exclusive OR input. In addition, one product term can be used as a logic expander, and thus there may be as many logic expanders as macrocells.

A preferred macrocell architecture permits allocation, in which additional product terms may be allocated from a neighboring macrocell, thereby increasing the maximum number of product terms available to a macrocell beyond the number physically included in each macrocell. For example, in a preferred embodiment comprising five product terms, additional product terms may be allocated to a first macrocell from a neighboring macrocell, thus allowing up to ten product terms to a macrocell.

Macrocells 260 and 270 can be substantially identical, but the ways in which their outputs are connected in PLD 100 differ. The outputs of macrocells 260 are connected via lines 140 to GIA 105 and to I/O pads 155, but the outputs of macrocells 270 are connected via lines 140 only to GIA 105 and not to I/O pads 155. Macrocells 260 can, therefore transmit data to I/O pads 155 and are thus termed "I/O macrocells," but macrocells 270 cannot communicate directly with I/O pads 155 and are thus termed "buried macrocells." In a preferred embodiment, ten out of sixteen macrocells in each LAB are I/O macrocells and the remaining six are buried macrocells.

In a preferred family of embodiments, PLD 100 can comprise, for example, from 32 to 512 macrocells. All members of the family can be implemented with the same uniform architecture based on high speed multiplexed Global Interconnect Array 105.

E. Global Interconnect Array

As described above, the present invention uses multiplexers 110 and a GIA 105 instead of programmable elements in an EPROM array. Alternatively, the present invention uses multiplexers 110, 210 and GIA 105 instead of programmable elements in an EPROM array.

In prior EPLDs with programmable interconnects such as the one described in the above-mentioned U.S. Pat. No. 4,871,930, programmability of the global signal interconnection was obtained by providing a programmable interconnect array in which every bit line intersected every global conductor, and by providing a programmable element such as an EPROM cell at every intersection. With these programmable elements, the user could connect selected global conductors to selected bit lines.

However, it has now been determined that the use of programmable elements at every intersection leads to an undesirably large power consumption, and that the capacitive loading of the elements on the global conductors and bit lines causes an undesirable decrease in speed. Furthermore, only a small fraction of the total number of programmable elements are actually used in any particular design. Thus, the disadvantageous effects were caused by elements that were largely redundant.

This unnecessary and disadvantageous power consumption and speed reduction is eliminated in the present invention in which a programmable element is not positioned at every intersection. Instead, selected global conductors are connected directly to the input of multiplexers, the outputs of the multiplexers are connected to the bit lines, and the multiplexers can be programmatically controlled by the user. Alternatively, the outputs of the multiplexers are connected to a second set of multiplexers which are connected to the bit lines. In such a configuration, all of the multiplexers can be programmatically controlled by the user with even greater flexibility.

In either configuration, the multiplexers must satisfy conflicting conditions. To ensure that the user has maximum flexibility in connecting global conductors to bit lines, the multiplexers should have as many inputs as possible. However, to keep the chip size as small as possible, the multiplexers should have as few inputs as possible. This conflict has been resolved in the present invention with an interconnection pattern which maximizes the flexibility for a given small number of inputs.

In a PLD comprising LABs, these conditions are satisfied if each LAB is fed by the outputs of multiplexers, the outputs of each LAB are partitioned into one or more groups of global conductors, and the global conductors are connected to the inputs of the multiplexers in a pattern which satisfies the following requirements:

R1 No two global conductors feed the same set of multiplexers (or first multiplexers when two sets of multiplexers are utilized).

R2 No multiplexer (or first multiplexer in a two multiplexer configuration) is fed by two global conductors in the same LAB.

R3 The global conductors in any two groups from different LABs and the multiplexers (including both sets of multiplexers in a two multiplexer configuration) they feed form an acyclic chain.

Requirements R1 and R2 can be written alternatively as:

R1′ The universe of multiplexers fed by any one global conductor differs from the universe of multiplexers fed by any other global conductor.

R2′ Any two inputs of any multiplexer (or pair of first and second multiplexers in a two multiplexer configuration) are connected to global conductors in different LABs.

Figure 4A:
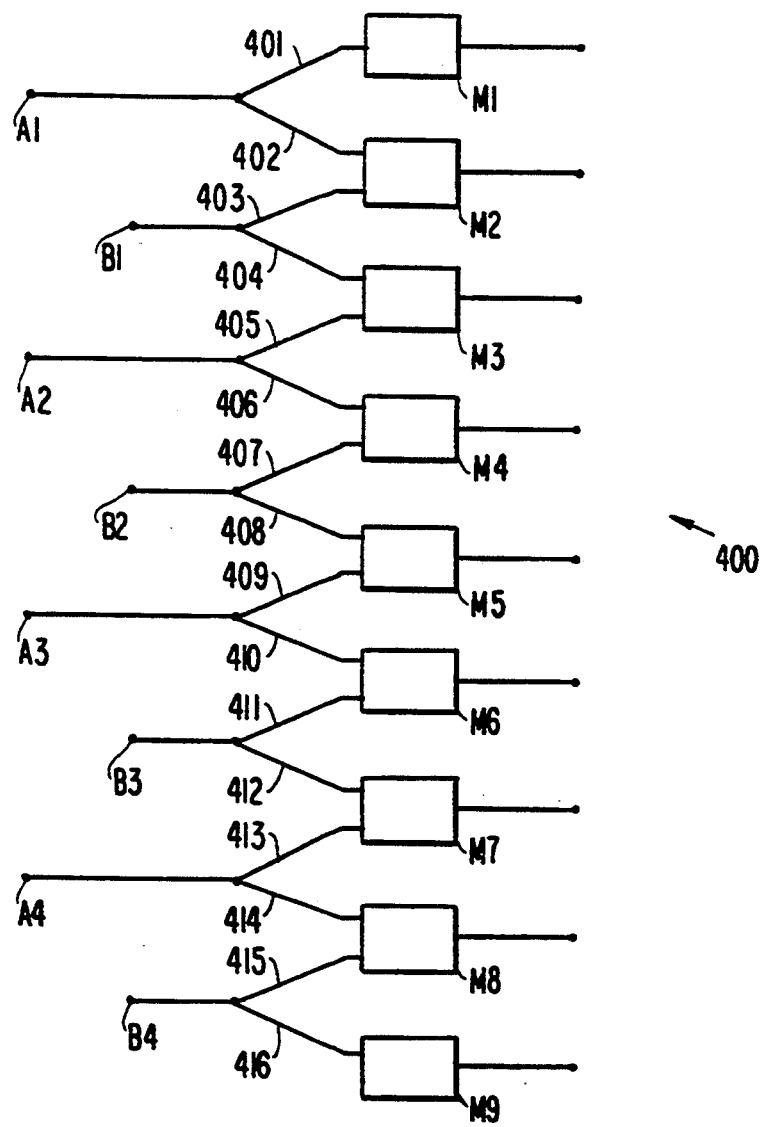
FIG. 4A is a schematic block diagram showing an interconnection of macrocells and multiplexers forming a chain without loops.

In one preferred embodiment, each global conductor is connected to two multiplexers per LAB. Requirement R3 calls for a pattern having an acyclic chain. Such a pattern is illustrated in FIG. 4A which shows an example of a possible interconnection pattern 400 having nine multiplexers labeled M1 to M9 fed by two groups of global conductors labeled A1 to A4 and B1 to B4. Interconnections 401 to 416 together with multiplexers M1 to M9 form an acyclic chain as follows: Each of interconnections 401 to 416 can be regarded as linking multiplexers M1 to M9 together in a chain. The chain is acyclic in the sense that, starting at any point in the chain and moving along it in a single direction, each point in the chain can be reached once at most.

Figure 4B:
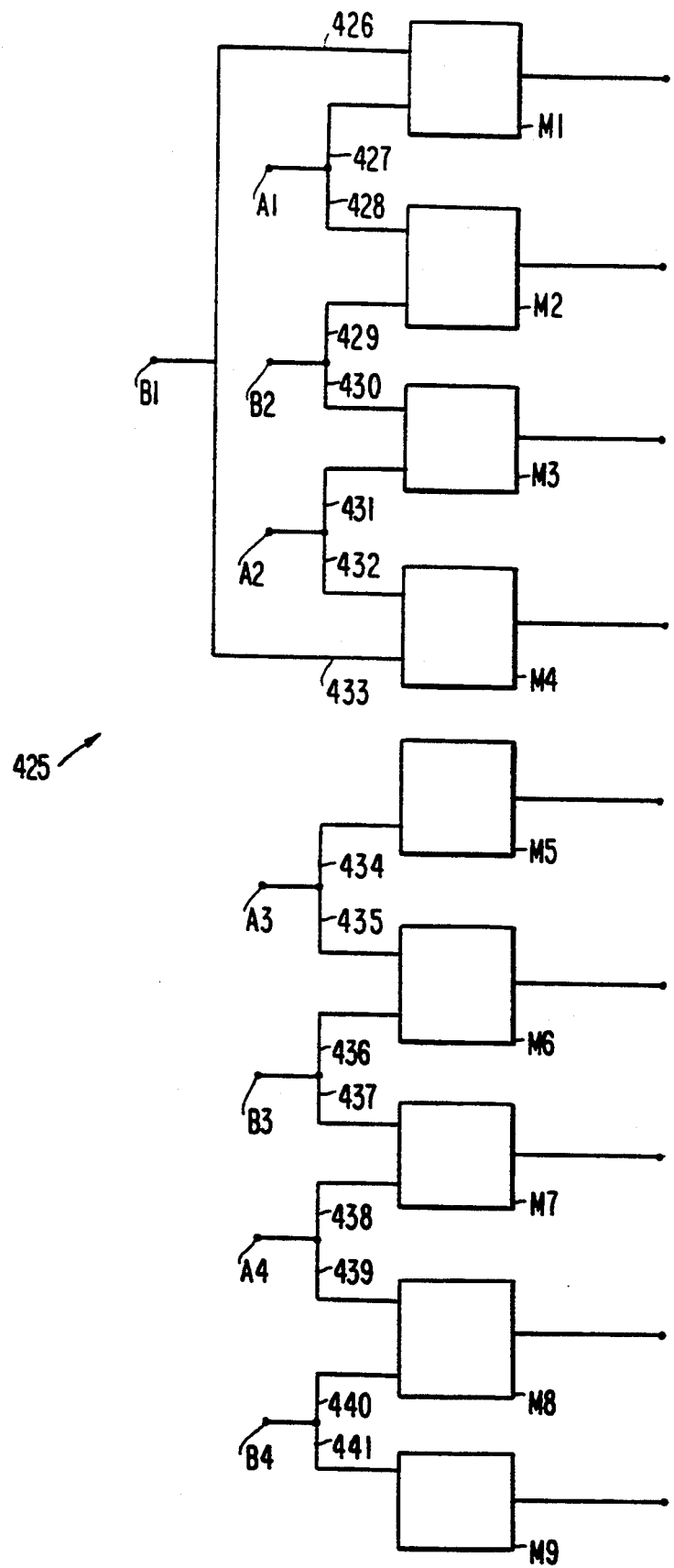
FIG. 4B is a schematic block diagram showing an interconnection of macrocells and multiplexers forming a chain with a loop.

In contrast, FIG. 4B shows an example of an interconnection pattern 425, using the same global conductors and multiplexers, which violates R3. In pattern 425, interconnections 426 to 430 and multiplexers M1 to M3 form a loop. Specifically, starting, for example, at multiplexer M1 and moving along the chain formed by interconnections and multiplexers 427, 428, M2, 429, 430, M3, 431, 432, M4, 433, and 426, multiplexer M1 can be reached again. Because multiplexer M1 can be reached more than once, pattern 425 is not acyclic (i.e., it has a loop).

Figure 4C:
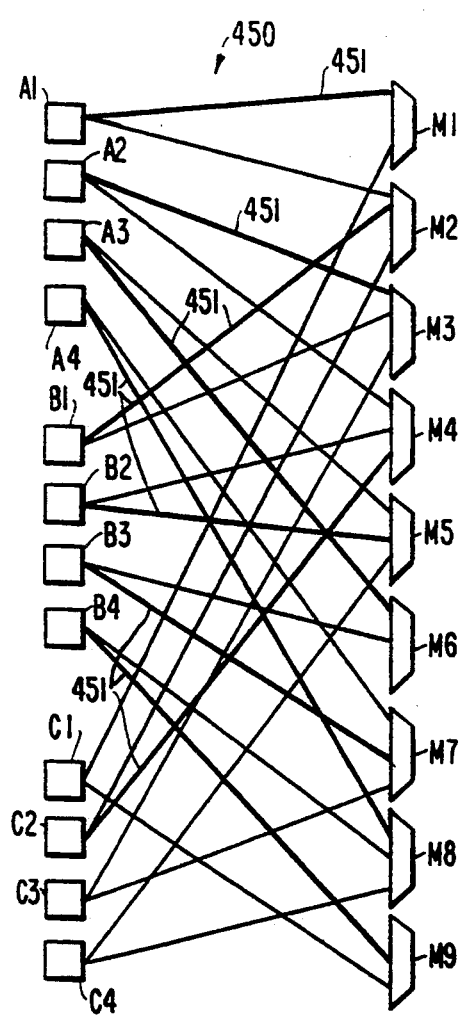
FIG. 4C is a schematic block diagram showing an interconnection of macrocells and multiplexers which maximizes routing ability.
Figure 4D:
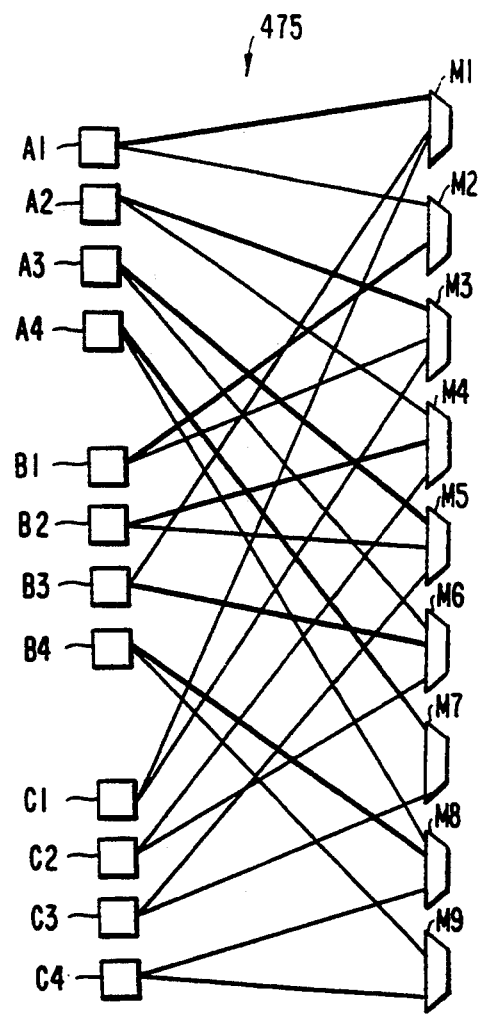
FIG. 4D is a schematic block diagram showing an interconnection of macrocells and multiplexers which does not maximize routing ability.

More realistic examples of interconnection patterns are shown in FIGS. 4C and 4D. FIG. 4C shows a preferred embodiment of an interconnection pattern 450 for nine multiplexers which satisfies R1 to R3 and hence maximizes the number of signals that can be routed through the multiplexers. As shown in FIG. 4C, four multiplexers may be fed by global conductors from any macrocells in one LAB, four multiplexers may be fed by global conductors from any macrocells in another LAB, and the remaining multiplexer may be fed by a global conductor from any macrocell from a third LAB. In this case, no macrocell will be prevented from being routed to the output of a multiplexer. A particular programmed assignment, in which each macrocell is assigned through a multiplexer to an output, is shown in FIG. 4C where heavy lines 451 indicate the macrocells assigned to the outputs of multiplexers M1 to M9.

Conversely, an interconnection pattern which does not satisfy R1 to R3 may not allow every macrocell to be routed to the output a multiplexer. For example, an interconnection pattern 475 which contains a loop and therefore does not satisfy R1 to R3 is shown in FIG. 4D. With pattern 475, there is no assignment in which macrocells C1 or C2 can be routed to the outputs of any multiplexer after macrocells A1 to A4 and B1 to B4 have been assigned.

FIG. 4E shows a tabular representation of a preferred embodiment of an interconnection pattern which satisfies requirements R1 to R3, having nine groups of four global conductors interconnected to nine 8-input multiplexers. In FIG. 4E, the global conductors are labeled F00A to F03I, where the final letter in the label signifies the group and the two digits in the label signifies the particular global conductor in the group. The multiplexers are labeled MUX00 to MUX08, and the individual multiplexer inputs are labeled @00 to @07. Thus, referring to the first row of the table in FIG. 4E, global conductor 00 of group A is connected to input 00 of multiplexer 00 and to input 00 multiplexer 02. Similarly, referring to the last row of the table in FIG. 4E, global conductor 03 of group I is connected to input 07 of multiplexer 05 and to input 07 of multiplexer 07.

Re-labeling or re-ordering the global conductors or multiplexers will result in substantially the same interconnect pattern.

If a PLD has a large number of LABs, it may not be possible to find a pattern which satisfies requirements R1 and R3 for all pairs of groups in all LABs. For example, if the global conductors were partitioned into groups of four and there were 36 multiplexers feeding each LAB, then there would be at most nine LABs satisfying requirements R1 and R3. If more LABs are required, then a pattern satisfying requirements R1 and R3 for a subset of the LABs could be repeated for each subsequent subset of LABs until all LABs are used with requirements R1 and R3 holding for all LABs from the same subset. Requirements R1 to R3 could be violated for LABs from different subsets.

The LABs' outputs are the outputs of its macrocells, and these outputs are fed back to become global conductors in the GIA. If a global conductor needs to feed multiple LABs, it may not be possible to successfully route all signals to their required destinations for some patterns. In these cases, a different pattern may be created by permuting the macrocells within one or more LABs so that some signals are assigned to different global conductors.

In a preferred embodiment shown in FIGS. 1A and 3A, GIA 105 is chosen to balance routability with speed. All macrocell outputs 140, all input pads 175, and I/O pads 155 drive a line (or conductor) in GIA 105. Selected lines 106 from GIA 105 are fed to the inputs of 24:1 multiplexers 110. Each LAB 130 is preferably fed by 36 multiplexers. The outputs of multiplexers 110 drive, through buffers 120, word lines 125 of local EPROM array 240 of LABs 130.

Each multiplexer 110 is controlled by architectural bits in local EPROM array 240 which establish which one of its inputs is routed to the multiplexer's output. During program mode, data is stored in these architectural bits to define the assignments.

F. Interconnection Assignment Algorithm

A computer aided engineering ("CAE") tool for implementing a user's custom circuit or logic design with a PLD must perform the following operations: (1) partition the logic into logic array blocks; (2) assign each logic element to a particular macrocell in each LAB (this is equivalent to assigning a given signal to a given global conductor); and (3) choose which multiplexer (or multiplexers in a two multiplexer configuration) should be used to route the signal on a given global conductor to a destination LAB where the signal is required, if this is possible. Steps (1) and (2) can be performed by algorithms which are well known in the art. The present invention relates to step (3).

Step (3) involves assigning a multiplexer (or pair of multiplexers) output to a selected one of its inputs. This is equivalent to switching the multiplexer to a mode in which the logical signal, or the complement of the logical signal, appearing at the selected input is propagated to the output. The two multiplexer configuration, which is slightly more complex to assign than the one multiplexer configuration (because a multiplexer may be in use by two different signals), is described in further detail below.

Given the specific interconnection pattern, such as pattern 450, established when the PLD chip is designed, it is necessary to provide a method for assigning macrocell outputs (or sources) to multiplexer outputs (or destinations) so as to implement the user's custom circuit.

Figure 5A:
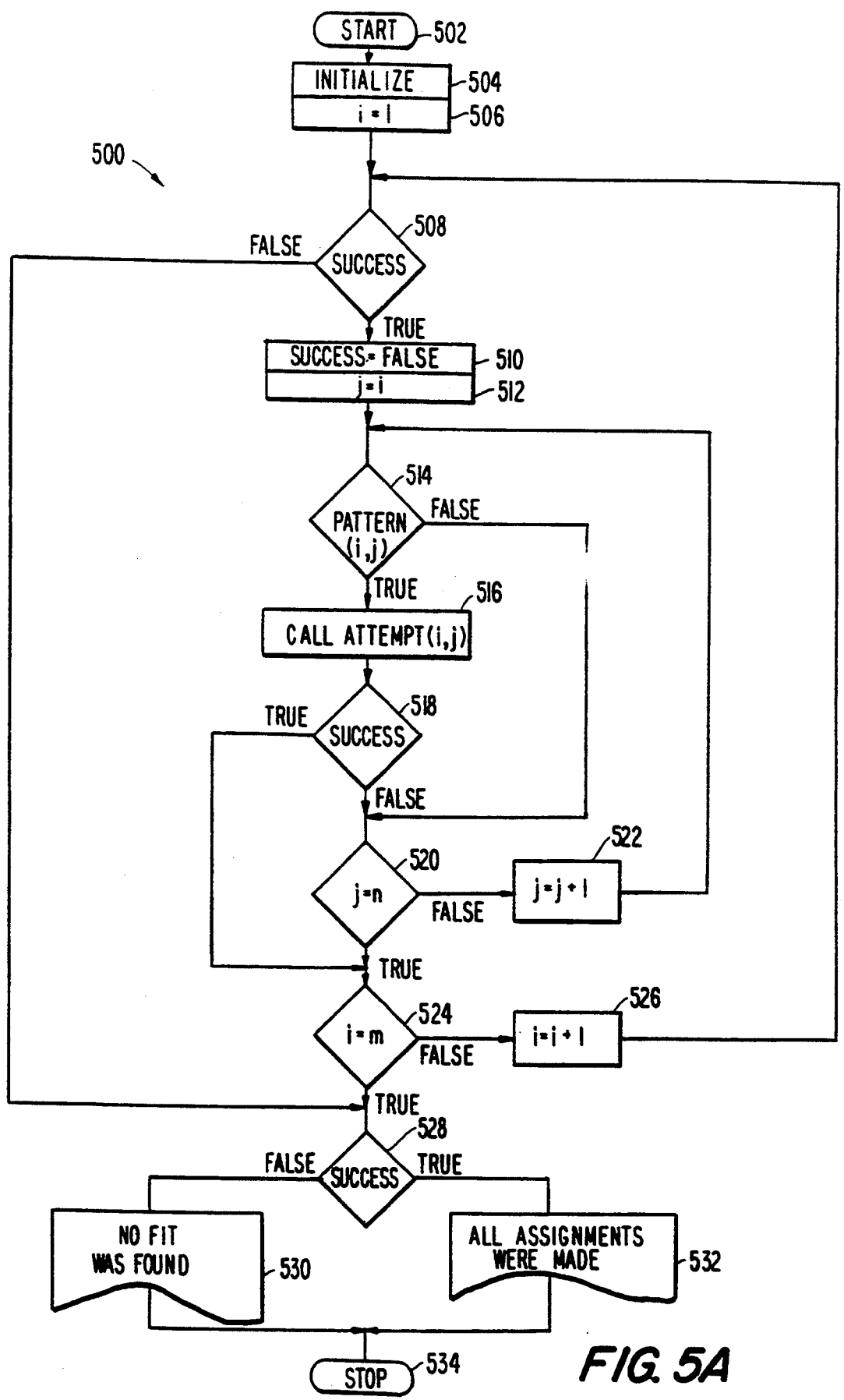
FIG. 5A is a flowchart of an algorithm for assigning global conductors (sources) to multiplexers (destinations)

Such a method is provided by algorithm 500 shown in flowchart form in FIG. 5A. Given a set of sources $\{s_i\}$ (which represents a set of global conductors to be assigned to a given LAB) and a set of destinations $\{d_i\}$ (which represents a set of multiplexers which feed into the given LAB) where each source can be coupled to two or more destinations according to an interconnection pattern satisfying requirements R1, R2, and R3 above, algorithm 500 attempts to find the subset of assignments from $\{s_i\}$ to $\{d_i\}$ such that each source is coupled to exactly one destination and, because there may be fewer sources than destinations, each destination is coupled to one source or to no source.

Algorithm 500 makes use of the following global variables:

m The total number of sources.
n The total number of destinations.
PATTERN A matrix of logical values with m rows and n columns in which the entry in the ith row and jth column, PATTERN(i,j), is true if the pattern allows connections from source $s_i$ to destination $d_j$, and is false otherwise.
ASSIGNED An array of n logical variables in which the jth entry, ASSIGNED(j), is true if destination $d_j$ has been successfully assigned, and false if it has not.
ASSIGNMENT An array of n integer variables in which, if destination $d_j$ has been assigned to source $s_i$, the jth entry, ASSIGNMENT(j), contains the integer i.
SUCCESS A logical variable which is set true if the recursive subroutine has been successful and is set false otherwise.
MARK An array of n logical values used to mark destinations temporarily.

In addition, the following local variables are used:

i, p Integers representing the labels of sources $s_i$ and $s_p$ respectively.
j, k Integers representing the labels of destinations $d_j$ and $d_k$ respectively.

Algorithm 500 starts at step 502 and proceeds immediately to step 504 where all variables are initialized; SUCCESS is set to true, PATTERN is loaded with its appropriate logical values, all entries of ASSIGNED are reset to false, all entries of MARK are reset to false, and all entries of ASSIGNMENT are reset to zero. At step 506, counter i is initialized to one and a loop is commenced at step 508 which attempts to assign each source.

At step 508, the algorithm determines if it has been successful in making assignments up to that stage. If it has not, it proceeds to step 528, which is discussed below. However, if it has been successful, it continues to attempt to make more assignments by moving on to step 510.

Next, variable SUCCESS is reset to false and counter j is initialized to one at steps 510 and 512 respectively. Following this, step 514 determines if the specific pattern allows source $s_i$ to be routed to destination $d_j$. If this allowed, the algorithm proceeds to call a recursive subroutine at step 516 which attempts to assign source $s_i$ to destination $d_j$. Step 518 then determines if the recursive subroutine was successful in assigning source $s_i$ to a destination. If it was, then the algorithm proceeds to step 524 to determine if there are any more sources to consider. However, if the assignment algorithm was not successful, the algorithm proceeds to step 520 to determine if there are any more destinations to consider.

At step 520, the algorithm determines if it has considered all destinations. If it has not, it increments counter j at step 522 and returns to step 514 to work on the next destination. However, if all destinations have been considered, the algorithm proceeds to step 524.

Similarly, at step 524, the algorithm determines if it has considered all sources. If it has not, it increments counter i at step 526 and returns to step 508 to work on the next source. However, if all sources have been considered, the algorithm proceeds to step 528.

The final result of the algorithm is evaluated at step 528. If the algorithm has been successful in making all assignments, an announcement to that effect can be made at step 532, and the variable ASSIGNMENT contains the optimum assignment. Conversely, if not all assignments were made, an announcement to that effect can be made at step 530. Finally, the algorithm stops at step 534.

Figure 5B:
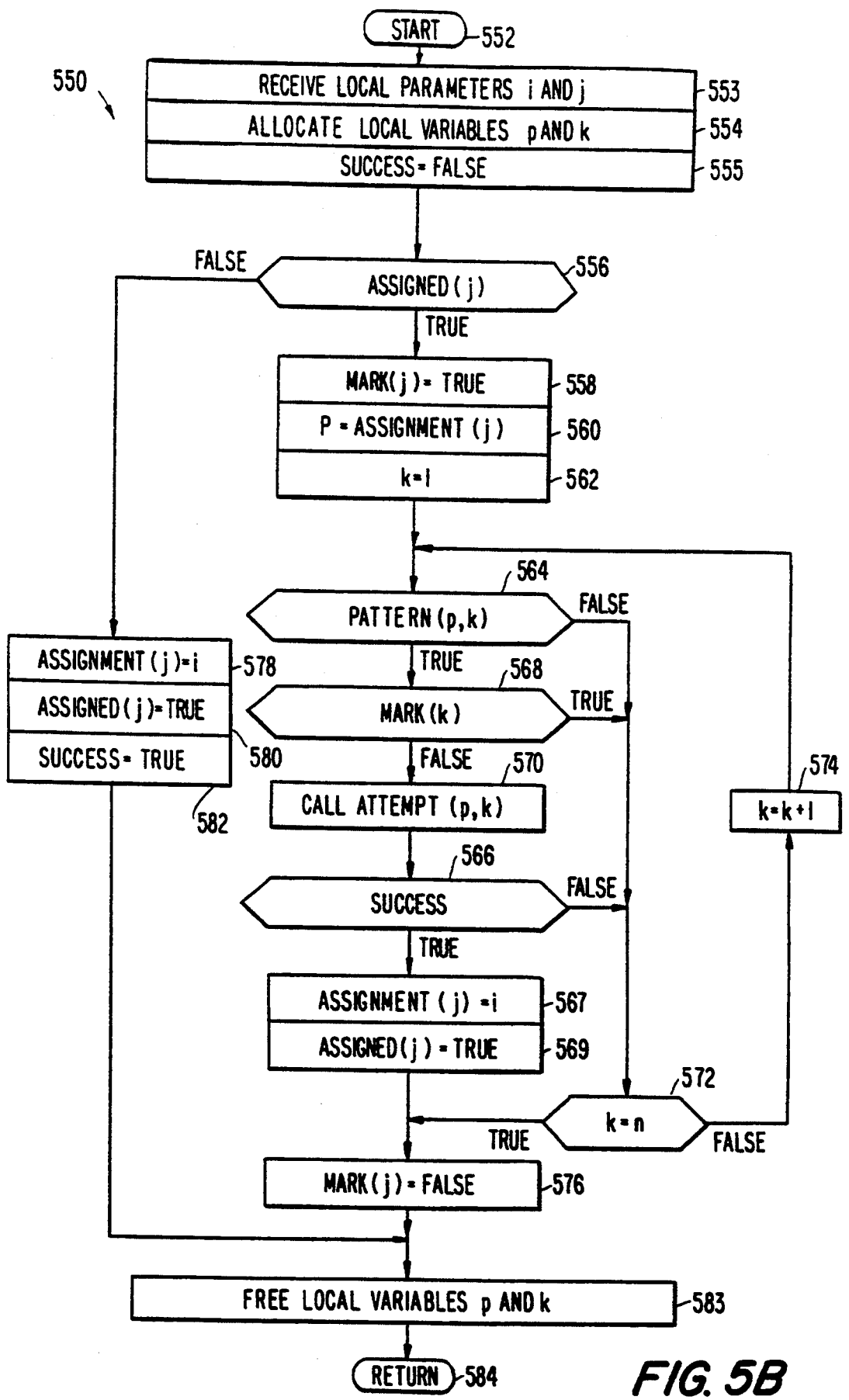
FIG. 5B is a flowchart of a recursive subroutine used in the algorithm of FIG. 5A.

As described above, algorithm 500 calls a recursive subroutine at step 516 to attempt to assign source $s_i$ to destination $d_j$. Recursive subroutine 550 either assigns source $s_i$ to destination $d_j$ if destination $d_j$ is not assigned, or else it attempts to remove the assignment from destination $d_j$ if it is already assigned. An exemplary flowchart for a recursive subroutine 550 for this purpose is shown in FIG. 5B.

Recursive subroutine 550 starts at step 552. When algorithm 500 calls recursive subroutine 550, it passes the parameters i and j, where i is the source index and j is the destination index; recursive subroutine 550 receives these parameters at step 553, but it shares global variables and data structures PATTERN, ASSIGNED, ASSIGNMENT, and SUCCESS with algorithm 500. Being a recursive subroutine, it allocates memory for local variables p and k at step 554. It then proceeds to step 555 where the logical variable SUCCESS is reset to false. At step 556, the recursive subroutine checks if destination $d_j$ has been successfully assigned.

If destination $d_j$ has not been assigned, source $s_i$ is assigned to it and control is returned to algorithm 500 in steps 578, 580, 582, 583, and 584 as follows: At step 578, the address of source $s_i$ is stored in ASSIGNMENT(j); at step 580, logical variable ASSIGNED(j) is set true to indicate that destination $d_j$ has been assigned; at step 582, the logical variable SUCCESS is set true; at step 583, local variables p and k are freed; and at step 584 the recursive subroutine returns control to the calling algorithm.

However, if destination $d_j$ has been assigned, then, from step 556, recursive subroutine 550 attempts to reassign current source $s_p$ from destination $d_j$ to a new destination $d_k$. This process starts at step 558 where a temporary mark is made to indicate that destination $d_j$ is being considered. At step 560, the address p of the source currently assigned to destination $d_j$ is noted. Counter k, which is an index pointing to potential new destinations, is initialized at step 562, and a loop is entered which steps through values of k from one to n, where n is the number of destinations.

The first two steps in the loop, steps 564 and 568, determine respectively if the pattern allows possible connection from source $s_p$ to destination $d_k$, and if destination $d_k$ is not currently marked. If either of these conditions is not met, the recursive subroutine proceeds to step 572. However, if both of these conditions are met, recursive subroutine 550 calls itself at step 570 to attempt to assign source $s_p$ to destination $d_k$.

Recursive subroutine 550 then proceeds to step 566 which determines if the subroutine's recursive call to itself was successful in finding a possible assignment. If the call was successful, the subroutine proceeds to step 567 where the address of source $s_i$ is stored in ASSIGNMENT(j), to step 569 where ASSIGNED(j) is set true, and then to step 576. However, if the call was not successful, the subroutine proceeds from step 566 to step 572.

At step 572, the recursive subroutine determines if all destinations have been considered. If not, then the value of counter k is incremented at step 574 and the recursive subroutine returns to step 564. However, if all destinations have been considered, the recursive subroutine proceeds to step 576.

At step 576, the temporary mark for destination $d_j$ is removed. Recursive subroutine 550 then proceed to step 583 where local variables p and k are freed, and recursive subroutine 550 finally returns control to calling algorithm 500 at step 584.

If each source is coupled to exactly two destinations, then the recursive subroutine will find a fit using a number of computations which is proportional to the number of sources multiplied by the number of destination multiplied by the depth of the recursion. The algorithm will have a better chance of finding a fit if the pattern allows deep nesting of the recursive assignment function than if only shallow nesting is possible.

Patterns which satisfy requirements R1 to R3 serve to maximize the length of the chain of recursive calls. Therefore, the algorithm together with patterns which satisfy requirements R1 to R3 provide a means of maximizing the ability of connecting specific sources to specific destinations.

If algorithm 500 is successful in assigning the required sources of a LAB to the required destinations of that LAB, the CAE tool can proceed to another LAB. If all sources of all LABs are assigned, the CAE tool has completed the design. If, however, algorithm 500 fails to assign any set of sources to its set of destinations, the CAE tool must repartition the logic into different logic array blocks, or reassign logic elements to different macrocells, and then attempt to assign sources to destinations again.

The two multiplexer embodiment of the present invention may require that the second multiplexers be designated as destinations which use the input fed by the first multiplexer of the same LAB as the second multiplexer (e.g., in FIG. 3C, multiplexer 210(1) would be set to use the input from multiplexer 110(1), not the input from multiplexer 110(2)). Then using this arrangement, as previously described, a PATTERN(i,j) is created and the algorithm is executed to route as many signals as possible.

When all possible routings have been completed, redesignate the unused second multiplexers (i.e., the multiplexers which do not have a signal assigned to them) to use the input fed by the first multiplexer in the alternate LAB (e.g., in FIG. 3C, multiplexer 210(1)—if unassigned—would now be set to use the input from multiplexer 110(2)). Once again, a PATTERN(i,j) is created using the redesignated multiplexer configuration and the algorithm is executed to route the remaining signals.

Figure 6:
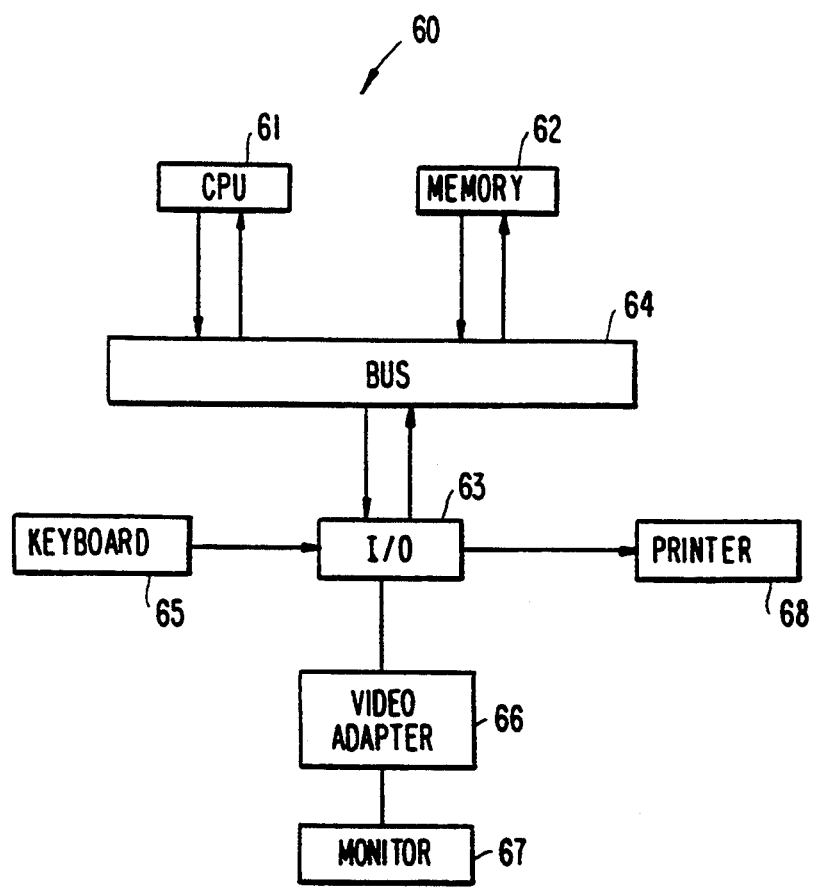
FIG. 6 is a schematic representation of a hardware system for implementing the algorithm of FIG. 5A.

An exemplary hardware system on which the interconnection assignment algorithm above can be implemented is diagrammed in FIG. 6. System 60 is preferably a personal computer (of the so-called IBM ®-compatible class) based on an Intel ® 80386 or better central processing unit ("CPU") 61. System 60 also has at least two megabytes of random access memory ("RAM") 62 and an I/O controller 63. CPU 61, RAM 62, and I/O controller 63 are all connected to a 32-bit bus 64.

Connected to I/O controller 63 are an input device 65 such as a keyboard, a video adapter 66 such as a video graphics array ("VGA") or better video adapter and compatible monitor 67. Also optionally connected to I/O controller 63 is a printer 68.

G. Redundancy Implementation

The programmable logic device of the present invention preferably uses polysilicon fuse redundancy for yield enhancement. Both word line redundancy and macrocell redundancy are preferably incorporated.

For word line redundancy, two spare word line pairs per LAB are used. The output of each word line driver can be programmatically coupled to either one of two word lines by blowing appropriate polyfuses. A damaged word line is replaced by blowing the polyfuses such that the outputs of the word line drivers are routed to undamaged word lines; i.e., by activating the spare word line pair and shifting the remaining good word lines around the damaged one.

Using this form of word line redundancy, the effect of short circuits between any two adjacent word lines can be eliminated. The effects can be eliminated whether the shorted word lines belong to the same word line pair, or to different word line pairs.

In addition, this form of word line redundancy can be used to eliminate the effect of two instances of shorted word line pairs if the word line pairs are on opposite sides of an LAB.

Implementation of word line redundancy requires one architectural bit per word line pair, and redundancy data are stored in architectural bit latches that are serially loaded from an isolated redundancy fuse site on the periphery of the chip.

For macrocell redundancy, each LAB has two spare macrocells including product terms. One spare macrocell is included for one half of the LAB and another spare macrocell is included for the other half of the LAB. The output of each macrocell can be programmatically coupled to either one of two global conductors by blowing appropriate polyfuses. A damaged macrocell is replaced by blowing the polyfuses such that the outputs of the undamaged macrocells are routed to the global conductors; i.e., a damaged macrocell is replaced by activating the spare macrocell on one end of the LAB and shifting the remaining macrocells around the damaged one.

With this form of macrocell redundancy, any single damaged macrocell, including the expander word line associated with the macrocell, can be replaced by a spare macrocell.

In addition, this form of macrocell redundancy can be used to eliminate the effect of two damaged macrocells if the damaged macrocells are on opposite sides of the LAB.

Implementation of macrocell redundancy requires one architectural bit per macrocell. Redundancy data are stored in architectural bit latches that are serially loaded from an isolated redundancy fuse site on the periphery of the chip.

H. Programming and Testing

The PLD of the present invention can operate in a number of modes including program mode in which the operation of the PLD is defined, verify mode in which the proper manipulation of data in the PLD is verified, test mode during which the expected operation of the PLD is checked, and operation mode in which the PLD performs its programmed operations.

In program mode, various EPROM cells in the PLD are selected and logical data is stored in them. In verify mode, the EPROM cells are selected and the data stored in them is read out.

During program and verify modes, two of the four dedicated input pads are redefined to have specific functions. One pad is used to supply voltage to the EPROM gates or word lines, and a second pad is used to supply voltage to the EPROM drains or bit lines.

EPROM cells are conventionally selected for programming and verifying using row and column decoders. However, in the preferred embodiment, a method more suitable for PLDs is used. In particular, these selections are made using a shift register scan path wherein each word line and each bit line is controlled by a shift register bit, and selection information is serially shifted into the registers. A logical "1" in the shift register bit will select the corresponding word line or bit line. This method results in simplification of program and verify circuits compared to the use of row and column decoders, and is compatible with a scan path testing scheme.

Because word lines and bit lines are selected with shift registers in certain test modes, the traditional reliability test modes such as Program Disturb and DC Erase can be achieved as subsets of the Program mode.

Data can also be stored in the architectural bit latches using the shift register scan path. Thus various macrocell architectures can be emulated and tested without actually programming the architectural bits.

Spare macrocells and word lines can also be tested without blowing the polyfuses by preloading the architectural bit latches controlling the redundancy resources.

Thus, a programmable logic device having a global interconnect array coupled to logic array blocks by programmable multiplexers is provided. One skilled in the art will appreciate that the present invention can be practiced by other than the described embodiment, which is presented for purposes of illustration and not of limitation, and the present invention is limited only by the claims which follow.

What is claimed is:

1. A programmable logic device for producing a plurality of first signals, each of which is a programmable logic function of a plurality of second signals, the programmable logic device comprising:

a plurality of logic array blocks, each of which has a plurality of inputs and at least one output with each output carrying a respective one of the plurality of first signals;

a plurality of global conductors, each global conductor being fed by a respective one of the plurality of second signals;

a plurality of first multiplexers, each of which has a plurality of inputs with each input being connected to a respective one of the global conductors, and an output; and a plurality of second multiplexers, each of which has a plurality of inputs with each input being connected to the output of a uniquely respective one of the first multiplexers, and an output connected to the input of a respective one of the logic array blocks, wherein each of the global conductors has two unique paths through two different first multiplexers to a single logic array block and each global conductor also has two unique paths from each one of the first multiplexers through two different second multiplexers to two different logic array blocks.

2. The programmable logic device of claim 1 wherein each global conductor carries a signal and each one of the plurality of first multiplexers can be programmed to select one of the signals on the global conductors connected to its inputs to be transferred to its output.

3. The programmable logic device of claim 2 wherein each output of the plurality of logic array blocks is connected to a respective one of the global conductors, the connections from logic array block outputs to global conductors form a specific pattern, and the outputs of each logic array block are partitioned into at least one group.

4. The programmable logic device of claim 3 wherein, in the specific pattern, the universe of first multiplexers fed by any one global conductor differs from the universe of first multiplexers fed by any other global conductor.

5. The programmable logic device of claim 3 wherein, in the specific pattern, any two inputs of any first multiplexer are connected to global conductors in different groups.

6. The programmable logic device of claim 3 wherein, in the specific pattern, the global conductors in any two groups from different logic array blocks together with the first multiplexers to whose inputs they are connected and the second multiplexers to which the outputs of the first multiplexers are connected form an acyclic chain.

7. The programmable logic device of claim 3 wherein the signals on the global conductors connected to the inputs of the plurality of first multiplexers are selected for transfer to the outputs of the second multiplexers by successively attempting to assign each global conductor to an output of one of the second multiplexers to which the global conductor is essentially connected in accordance with the specific pattern until all second multiplexer outputs are assigned, or until all possible assignments have been attempted.

8. The programmable logic device of claim 7 wherein each successive attempt attempts to assign each global conductor to an output of one of the second multiplexers to which the global conductor is essentially connected in the specific pattern using a procedure which operates recursively by:

switching a first one of the first multiplexers to propagate signals from a first global conductor to the output of a first one of the second multiplexers if the first one of the first multiplexers has not been switched to propagate signals from any other global conductor to the output of the first one of the second multiplexers and the first one of the second multiplexers has not been switched to propagate signals from any other global conductor; or if a second global conductor has already been assigned to the output of the first one of the first multiplexers, by attempting to assign the first global conductor to a second one of the first multiplexers and a second one of the second multiplexers; or if the first one of the second multiplexers has already been assigned to the output of one of the first multiplexers, by attempting to assign the first global conductor to a second one of the first multiplexers and a second one of the second multiplexers.

9. The programmable logic device of claim 1 further comprising input and output pads controlled by tri-state buffers having means for programmatically controlling output voltage slew rate.

10. The programmable logic device of claim 1 wherein the logic array blocks further comprise macrocells and spare macrocells, the logic array blocks having means for replacing defective macrocells with spare macrocells.

11. The programmable logic device of claim 1 wherein the logic array blocks further comprise a plurality of word lines and a plurality of spare word lines, the logic array blocks having means for replacing defective word lines with spare word lines.

12. The programmable logic device of claim 1 further comprising a plurality of logical elements wherein the logical state of each logical element can be set to a desired state by connecting the logical elements in a serial arrangement having a first element whose state can be controlled and by passing a logical state string sequentially into the first element and through the serial arrangement until the desired state is obtained in each logical element.

13. The programmable logic device of claim 1 further comprising a plurality of logical elements wherein the logical state of each logical element can be monitored by connecting the logical elements in a serial arrangement having a last element whose state can be monitored such that the logical states of the logical elements form a logical state string, sequential passing the logical state string through the serial arrangement, and monitoring the logical state of the last element in the serial arrangement.

14. In a programmable logic device, a method for producing a plurality of first signals, each of which is a programmable logic function of a plurality of second signals, the method comprising the steps of:

providing a plurality of logic array blocks, each of which has a plurality of inputs and a plurality of outputs with each output carrying a respective one of the plurality of first signals;

providing a plurality of global conductors;

providing a plurality of first multiplexers, each of which has a plurality of inputs and an output;

providing a plurality of second multiplexers, each of which has a plurality of inputs and an output;

feeding each one of the plurality of second signals to a respective one of the plurality of global conductors;

connecting each one of the inputs of the plurality of first multiplexers to at least a respective one of the plurality of global conductors;

connecting each one of the outputs of the plurality of first multiplexers to a respective input of at least two of the plurality of second multiplexers, such that each of the plurality of first multiplexers is coupled to two different logic array blocks; and connecting each one of the outputs of the plurality of second multiplexers to a respective one of the inputs of the plurality of logic array blocks.

15. For use in a programmable logic device for producing a plurality of first signals with each of the first signals being a programmable logic function of a plurality of second signals, the programmable logic device comprising a plurality of logic array blocks with each logic array block having a plurality of inputs and a plurality of outputs with each output carrying a respective one of the plurality of first signals, a plurality of global conductors, with each global conductor being fed by a respective one of the plurality of second signals, a plurality of programmable first multiplexers and a plurality of programmable second multiplexers with each multiplexer having a plurality of inputs and an output with the inputs of the plurality of first multiplexers being connected to the plurality of global connectors in a specific interconnection pattern and the output of each of the plurality of first multiplexers being connected to one of the inputs of the plurality of second multiplexers and the output of each of the plurality of second multiplexers being connected to the input of a respective one of the logic array blocks, a system for assigning each one of the plurality of second signals to a respective logic array block input, the system comprising:

means for obtaining the specific interconnection pattern; and means for selecting signals on the global conductors connected to the inputs of the plurality of first multiplexers for transfer to the outputs of the plurality of second multiplexers, said selecting means comprising means for successively attempting to assign each global conductor to a first multiplexer to which the global conductor is connected in accordance with the specific interconnection pattern until all multiplexers have been assigned, or until all possible assignments have been attempted.

16. The system of claim 15 wherein the successive attempting means attempts to assign each global conductor to an output of one of the second multiplexers to which the global conductor is essentially connected in the specific pattern using a procedure which operates recursively by:

switching a first one of the first multiplexers to propagate signals from a first global conductor to the output of the first one of the first multiplexers if the first one of the first multiplexers has not been switched to propagate signals from any other global conductor to the output of a first one of the second multiplexers; or if a second global conductor has already been assigned to the output of the first one of the first multiplexers, by attempting to assign the first global conductor to a second one of the first multiplexers and a second one of the second multiplexers; or if the first one of the second multiplexers has already been assigned to the output of one of the first multiplexers, by attempting to assign the first global conductor to a second one of the first multiplexers and a second one of the second multiplexers.

17. For use in a programmable logic device for producing a plurality of first signals with each of the first signals being a programmable logic function of a plurality of second signals, the programmable logic device comprising a plurality of logic array blocks with each logic array block having a plurality of inputs and a plurality of outputs with each output carrying a respective one of the plurality of first signals, a plurality of global conductors, with each global conductor being fed by a respective one of the plurality of second signals, a plurality of programmable first multiplexers and a plurality of programmable second multiplexers with each multiplexer having a plurality of inputs, such that the inputs of the plurality of first multiplexers are connected to the plurality of global conductors in a specific interconnection pattern and each output of the plurality of first multiplexers is connected to an input of at least two of the plurality of second multiplexers and the output of each of the plurality of second multiplexers is connected to the input of a respective one of the logic array blocks, a method for assigning each one of the plurality of second signals to a respective logic array block input, the method comprising the steps of:

obtaining the specific interconnection pattern; and selecting signals on the global conductors connected to the inputs of the plurality of first multiplexers for transfer to the outputs of the second multiplexers by successively attempting to assign each global conductor to one of the plurality of first multiplexers to which the global conductor is connected in accordance with the specific interconnection pattern until all multiplexers have been assigned, or until all possible assignments have been attempted.

18. The method of claim 17 wherein the successive attempting step attempts to assign each global conductor to an output of one of the plurality of second multiplexers to which the global conductor is essentially connected in the specific pattern using a procedure which operates recursively by:

switching a first one of the first multiplexers to propagate signals from a first global conductor to the output of a first one of the second multiplexers if the first one of the first multiplexers has not been switched to propagate signals from any other global conductor to the output of the first one of the second multiplexers; or if a second global conductor has already been assigned to the output of the first one of the first multiplexers, by attempting to assign the first global conductor to a second one of the first multiplexers and a second one of the second multiplexers; or if the first one of the second multiplexers has already been assigned to the output of one of the first multiplexers, by attempting to assign the first global conductor to a second one of the first multiplexers and a second one of the second multiplexers.

19. The method of claim 18 wherein at least one of the plurality of second signals is fed to a different global conductor if the procedure cannot assign the output of each first multiplexer to a global conductor.

20. A programmable logic circuit for producing a plurality of first signals, each of which is a programmable logic function of a plurality of second signals, the programmable logic circuit comprising:

a plurality of logical arrays, each logical array having a plurality of inputs and at least one output with each output carrying a respective one of the plurality of first signals;

a plurality of global conductors, each global conductor being fed by a respective one of the plurality of second signals;

a plurality of first multiplexers, each of which has a plurality of inputs with each input being connected to a respective one of the global conductors, and an output; and a plurality of second multiplexers, each of which has a plurality of inputs with each input being connected to the output of a uniquely respective one of the first multiplexers, and an output connected to the input of a respective one of the logic array blocks, wherein each of the global conductors has two unique paths through two different first multiplexers to a single logic array block and each global conductor also has two unique paths from each one of the first multiplexers through two different second multiplexers to two different logic array blocks.

21. The programmable logic circuit of claim 20 wherein the logical arrays further comprise logic members and spare logic members, the logical arrays having means for replacing defective logic members with spare logic members.

22. The programmable logic circuit of claim 20 wherein the logical arrays further comprise a plurality of word lines and a plurality of spare word lines, the logical arrays having means for replacing defective word lines with spare word lines.

23. The programmable logic circuit of claim 20 further comprising input and output pads controlled by tri-state buffers having means for programmatically controlling output voltage slew rate.

24. The programmable logic circuit of claim 20 further comprising a plurality of logical elements wherein the logical state of each logical element can be set to a desired state by connecting the logical elements in a serial arrangement having a first element whose state can be controlled and by passing a logical state string sequentially into the first element and through the serial arrangement until the desired state is obtained in each logical element.

25. The programmable logic circuit of claim 20 further comprising a plurality of logical elements wherein the logical state of each logical element can be monitored by connecting the logical elements in a serial arrangement having a last element whose state can be monitored such that the logical states of the logical elements form a logical state string, sequentially passing the logical state string through the serial arrangement, and monitoring the logical state of the last element in the serial arrangement.

26. The programmable logic circuit of claim 20 wherein each global conductor carries a signal and each one of the plurality of first multiplexers can be programmed to select one of the signals on the global conductors connected to its inputs to be transferred to its output.

27. The programmable logic circuit of claim 26 wherein each output of the plurality of logical arrays is connected to a respective one of the global conductors, the connections from logical array outputs to global conductors form a specific pattern, and the outputs of each logical array are partitioned into at least one group.

28. The programmable logic circuit of claim 27 wherein, in the specific pattern, the universe of first multiplexers fed by any one global conductor differs from the universe of first multiplexers fed by any other global conductor.

29. The programmable logic circuit of claim 27 wherein, in the specific pattern, any two inputs of any first multiplexer are connected to global conductors in different groups.

30. The programmable logic circuit of claim 27 wherein, in the specific pattern, the global conductors in any two groups form different logical arrays together with the first multiplexers to whose inputs they are connected form an acyclic chain.

31. The programmable logic circuit of claim 27 wherein the signals on the global conductors connected to the inputs of the plurality of first multiplexers are selected for transfer to the outputs of the second multiplexers by successively attempting to assign each global conductor to an output of one of the first multiplexers to which the global conductor is connected in accordance with the specific pattern until all multiplexer outputs are assigned, or until all possible attempts have been attempted.

32. The programmable logic circuit of claim 31 wherein each successive attempt attempts to assign each global conductor to an output of one of the second multiplexers to which the global conductor is essentially connected in the specific pattern using a procedure which operates recursively by:

switching a first one of the first multiplexers to propagate signals from a first global conductor to the output of a first one of the second multiplexers if the first one of the first multiplexers has not been switched to propagate signals from any other global conductor to the output of the first one of the second multiplexers; or if a second global conductor has already been assigned to the output of the first one of the first multiplexers, by attempting to assign the first global conductor to a second one of the first multiplexers and a second one of the second multiplexers; or if the first one of the second multiplexers has already been assigned to the output of one of the first multiplexers, by attempting to assign the first global conductor to a second one of the first multiplexers and a second one of the second multiplexers.

* * * * *